United States Patent
Wofford et al.

(10) Patent No.: US 7,118,959 B2
(45) Date of Patent: Oct. 10, 2006

(54) INTEGRATED CIRCUIT CAPACITOR HAVING ANTIREFLECTIVE DIELECTRIC

(75) Inventors: Bill Alan Wofford, Dallas, TX (US); Blake Ryan Pasker, Wylie, TX (US); Xinfen Chen, Plano, TX (US); Binghua Hu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/077,074

(22) Filed: Mar. 10, 2005

(65) Prior Publication Data

US 2006/0205140 A1    Sep. 14, 2006

(51) Int. Cl.
   *H01L 21/8242* (2006.01)
(52) U.S. Cl. .................. 438/253; 438/393; 438/396; 438/952
(58) Field of Classification Search .......... 438/239, 438/250, 253, 393, 396, FOR. 220, FOR. 430, 438/72, 952
See application file for complete search history.

(56) References Cited

U.S. PATENT DOCUMENTS

| | | | |
|---|---|---|---|
| 5,049,514 A | * | 9/1991 | Mori .................. 438/301 |
| 5,626,906 A | * | 5/1997 | Summerfelt et al. ..... 427/126.3 |
| 5,805,408 A | * | 9/1998 | Maraschin et al. ......... 361/234 |
| 6,096,404 A | * | 8/2000 | Ghantiwala ............... 428/138 |
| 6,291,315 B1 | * | 9/2001 | Nakayama et al. ......... 438/459 |
| 6,376,787 B1 | * | 4/2002 | Martin et al. ............... 200/181 |
| 6,399,515 B1 | * | 6/2002 | Tao et al. .................. 438/734 |
| 6,534,809 B1 | * | 3/2003 | Moise et al. ............... 257/295 |
| 6,576,526 B1 | | 6/2003 | Kai et al. |
| 6,686,237 B1 | | 2/2004 | Wofford et al. |
| 6,703,285 B1 | | 3/2004 | Arakawa et al. |
| 6,806,196 B1 | | 10/2004 | Wofford et al. |
| 2002/0195633 A1 | * | 12/2002 | Nagano et al. ............ 257/296 |
| 2002/0197844 A1 | * | 12/2002 | Johnson et al. ............ 438/618 |

* cited by examiner

*Primary Examiner*—George R. Fourson
*Assistant Examiner*—Joannie Adelle Garcia
(74) *Attorney, Agent, or Firm*—Peter K. McLarty; W. James Brady, III; Frederick J. Telecky, Jr.

(57) ABSTRACT

A capacitor (100) is disclosed that is formed as part of an integrated circuit (IC) fabrication process. The capacitor (100) has conductive top and bottom electrodes (140, 144) and a nonconductive capacitor dielectric (142). In one example, the dielectric (142) includes first and second thin dielectric layers (112, 114) that sandwich a layer of antireflective material (118). The thin layers (112, 114) provide the dielectric behavior necessary for the capacitor while the antireflective layer (118) promotes reduced feature sizes by mitigating reflected standing waves, among other things.

14 Claims, 6 Drawing Sheets

INTEGRATED CIRCUIT CAPACITOR HAVING ANTIREFLECTIVE DIELECTRIC

FIELD OF INVENTION

The present invention relates generally to semiconductor devices, and more particularly to an integrated circuit capacitor where a dielectric of the capacitor comprises an antireflective material.

BACKGROUND OF THE INVENTION

It can be appreciated that several trends presently exist in the electronics industry. Devices are continually getting smaller, faster and require less power, while simultaneously being able to support and perform a greater number of increasingly complex and sophisticated functions. One reason for these trends is an ever increasing demand for small, portable and multifunctional electronic devices. For example, cellular phones, personal computing devices, and personal sound systems are devices which are in great demand in the consumer market. These devices rely on one or more small batteries as a power source and also require an ever increasing computational speed and storage capacity to store and process data, such as digital audio, digital video, contact information, database data and the like.

Accordingly, there is a continuing trend in the semiconductor industry to manufacture integrated circuits (ICs) with higher device densities. To achieve such high densities, there has been and continues to be efforts toward scaling down dimensions (e.g., at submicron levels) on semiconductor wafers. In order to accomplish such high densities, smaller feature sizes, smaller separations between features and layers, and/or more precise feature shapes are required, such as metal interconnects or leads, for example. The scaling-down of integrated circuit dimensions can facilitate faster circuit performance and/or switching speeds, and can lead to higher effective yield in IC fabrication processes by providing more circuits on a semiconductor die and/or more die per semiconductor wafer, for example,—where this also satisfies or furthers ongoing desires to streamline fabrication processes, enhance efficiency and/or reduce costs.

By way of example, high precision analog integrated circuits (IC's), such as analog-to-digital and digital-to-analog converters, for example, often require a number of capacitors for proper operation. Some of the capacitor requirements in a true eighteen bit converter IC, for example, are a ratio stability of less than 0.00075% over 10 years, a voltage coefficient of less than 10 ppm per volt, a temperature drift match of less than 0.05% per degree Celsius, dielectric absorption of less than 0.00075% and capacitance greater than 0.5 fF per square micrometer, among other things.

Such integrated circuit capacitors are generally formed as part of the IC fabrication process whereby a thin dielectric layer is established between two conductive plates. However, conventional IC fabrication techniques, such as patterning and/or etching, for example, have limitations as to the size and/or accuracy to which features can be produced thereby. It would, therefore, be desirable to be able to form one or more integrated circuit capacitors in a cost effective manner that allows smaller feature sizes to be more accurately produced without complicating the fabrication process so that device scaling can be furthered.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to forming an integrated circuit (IC) capacitor in an efficient manner that allows smaller feature sizes to be more accurately produced. In particular, a layer of dielectric material that is utilized to establish a capacitor dielectric includes antireflective material. The antireflective material mitigates the occurrence of certain phenomena, such as standing waves, for example, that can degrade the fidelity, accuracy and/or precision of fabrication techniques, such as patterning and/or etching, for example. The materials utilized to form the layer of dielectric material are commonly found in IC fabrication process, and, as such, the capacitor can be accurately and precisely produced in a cost effective manner that allows feature sizes to be reduced.

According to one or more aspects of the present invention, a method of forming a capacitor as part of an integrated circuit (IC) fabrication process is disclosed. The method includes providing a semiconductor substrate having a first layer of metallization formed thereon and forming a layer of antireflective dielectric material over the first layer of metallization. A second layer of metallization is then formed over the layer of antireflective dielectric material. The second layer of metallization, the layer of antireflective dielectric material and the first layer of metallization are then patterned to establish the capacitor which has a top conductive electrode formed from the second layer of metallization, a nonconductive capacitor dielectric formed from the layer of antireflective dielectric material and a bottom conductive electrode formed from the first layer of metallization.

According to one or more other aspects of the present invention, a capacitor is disclosed that is formed as part of an integrated circuit (IC) fabrication process. The capacitor includes a bottom conductive electrode formed on a semiconductor substrate, an antireflective nonconductive capacitor dielectric formed over the bottom conductive electrode, and a top conductive electrode formed over the antireflective nonconductive capacitor dielectric. The antireflective nonconductive capacitor dielectric mitigates adverse effects associated with reflections associated with forming the bottom conductive electrode.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
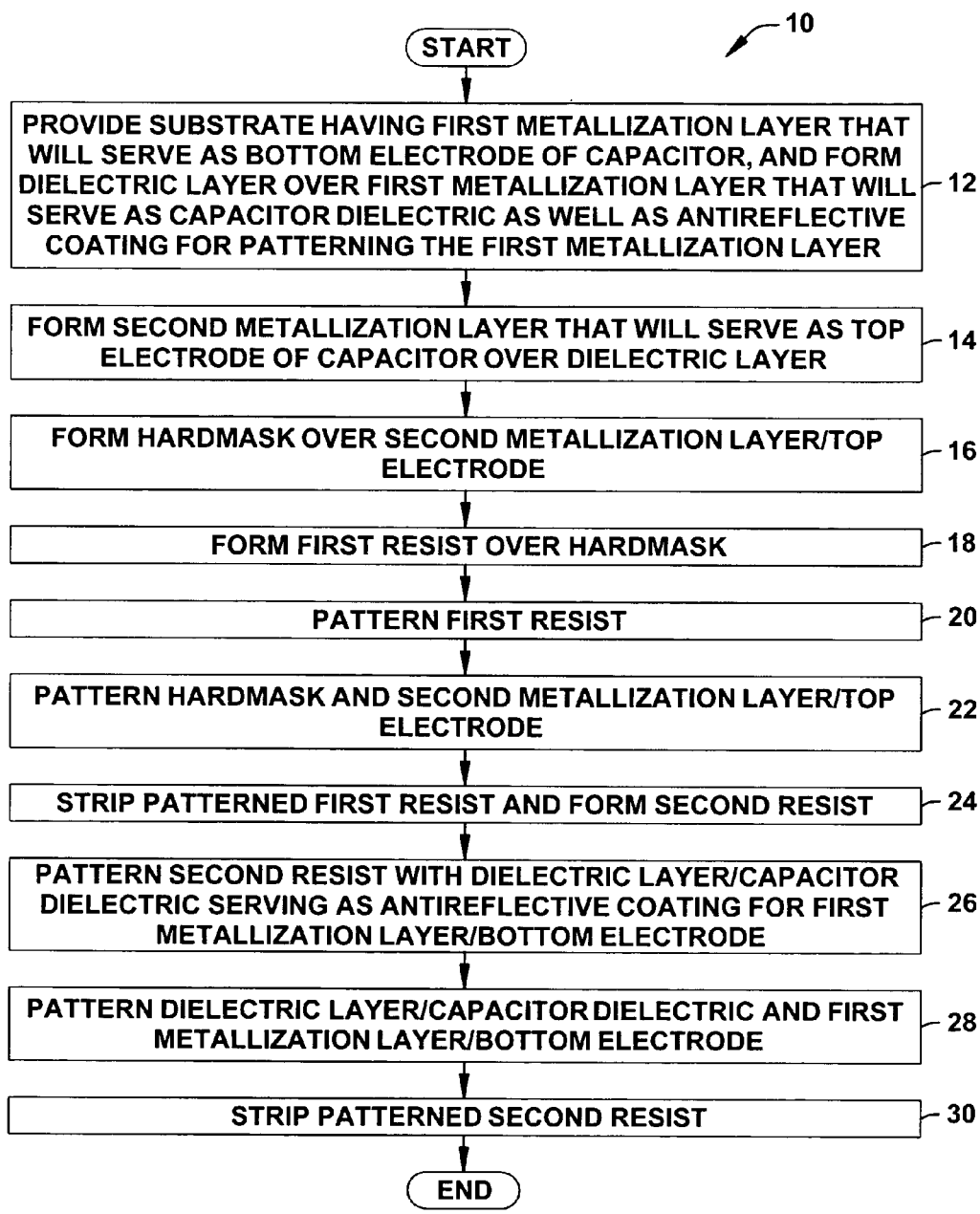
FIG. 1 is a flow diagram illustrating an exemplary methodology for forming an integrated circuit (IC) capacitor in accordance with one or more aspects of the present invention.

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

Turning to FIG. 1, an exemplary methodology 10 is illustrated for forming a capacitor according to one or more aspects of the present invention, such as at a back end of a fabrication process, for example. Although the methodology 10 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

The methodology 10 begins at 12 wherein a semiconductor substrate is provided or obtained that has been processed through formation of a first metallization layer. It is to be appreciated that substrate or semiconductor substrate as used herein can include a base semiconductor wafer or any portion thereof (e.g., one or more wafer die) as well as any epitaxial layers or other type of semiconductor layers formed thereover and/or associated therewith. The substrate can comprise, for example, silicon, SiGe, GaAs, InP and/or SOI. In addition, the substrate can include various device elements formed therein such as transistors, for example, and/or layers thereon. These can include metal layers, barrier layers, dielectric layers (e.g., inter level dielectric (ILD)), device structures, including silicon gates, word lines, source regions, drain regions, bit lines, bases, emitters, collectors, conductive lines, conductive vias, etc. The first metallization layer will serve as a bottom electrode of the capacitor, and a layer of dielectric material is formed over the first metallization layer according to one or more aspects of the present invention, where the layer of dielectric material will serve as a dielectric layer of the capacitor as well as an antireflective coating for patterning the first metallization layer.

Figure 2:
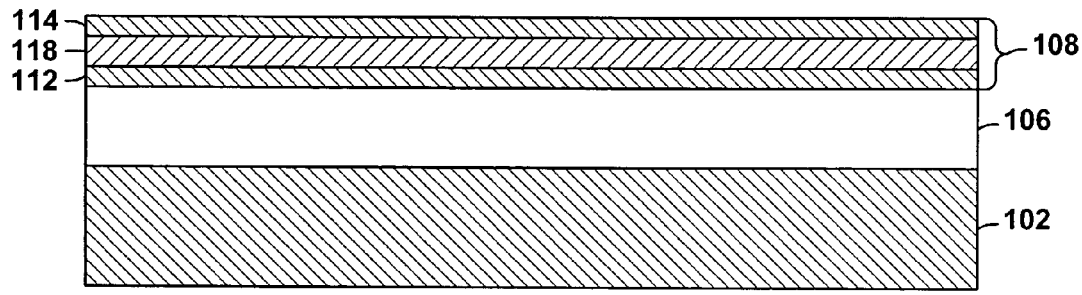
FIGS. 2–11 are cross-sectional illustrations of a capacitor being formed according to one or more aspects of the present invention, such as the methodology set forth in FIG. 1.

FIG. 2 is a cross-sectional illustration of a semiconductor substrate 102 processed through this point of the fabrication process. The first metallization layer 106 is formed over the substrate 102 and the dielectric layer 108 is formed over the first metallization layer 106. In the illustrated example, the layer of dielectric material 108 comprises a sandwich of three materials, namely first and second layers of a thin dielectric (or non-conductive) material 112, 114 that sandwich a layer of antireflective material 118. The dielectric materials 112, 114 are primarily responsible for providing the dielectric behavior needed for the capacitor, while the antireflective layer 118 is primarily responsible for allowing the dielectric layer 108 to function as an antireflective coating in patterning the first metallization layer 106, thus streamlining the process (e.g., by not requiring a separate layer of antireflective material—that has to be applied, patterned and removed to pattern the first metallization layer 106). Nevertheless, the layer of antireflective material 118 is also a dielectric such that if the composition and/or thickness of any of the three layers 112, 114, 118 are altered, the dielectric properties and capacitor performance (e.g., capacitance and dielectric absorption) are affected. Similarly, changing the composition and/or thickness of any of the three layers 112, 114, 118 also changes the reflectivity of the stack (e.g., its antireflective behavior). In this manner, the sandwich of layers 112, 114, 118 functions as a unit for both dielectric and antireflective behavior. As such, the dielectric layer 108 is sometimes referred to as a layer of antireflective dielectric material or a dielectric and antireflective sandwich.

It is to be appreciated that, while three layers 112, 114, 118 are presented in the illustrated example, the antireflective dielectric material 108 may merely comprise two layers, namely a predominately dielectric layer, such as layer 114, overlying a predominately antireflective layer, such as layer 118. In this arrangement, however, both layers would again function as a unit contributing to both the antireflective and dielectric behavior of the antireflective dielectric material 108, such that changing the thickness and/or composition of either of the layers would alter resulting dielectric properties and capacitor performance. Stated another way, the layer of antireflective dielectric material 108 comprises at least one layer, such as layer 118, that is substantially more absorbing than one or more other layers, such as layers 112, 114, that are substantially more nonconductive (dielectric) than the absorbing (antireflective) layer.

It will be appreciated that the three part (or two part) dielectric layer 108 can be efficiently formed since the materials comprising this layer 108 are generally present in an integrated circuit (IC) fabrication process. By way of example, the first and third layers 112, 114 of dielectric and antireflective sandwich 108 may comprise an oxide based material (O) and may be formed to respective thicknesses of between about 30 and about 100 Angstroms, for example. Similarly, the second layer 118 of dielectric and antireflective sandwich 108 may comprise a silicon oxy-nitride material (SiON), for example, formed to a thickness of between about 150 and about 500 Angstroms, for example. Additionally, the first metallization layer 106 may comprise one or more layers of conductive material. By way of example, the first metallization layer 106 may comprise an about 500 Angstrom layer of titanium nitride (TiN) overlying an about 200 Angstrom layer of Titanium (Ti) that overlies an about 5 kilo Angstrom layer of Aluminum (Al) and/or copper (Cu) overlying an about 140 Angstrom layer of titanium (Ti) that overlies the semiconductor substrate 102.

Figure 3:
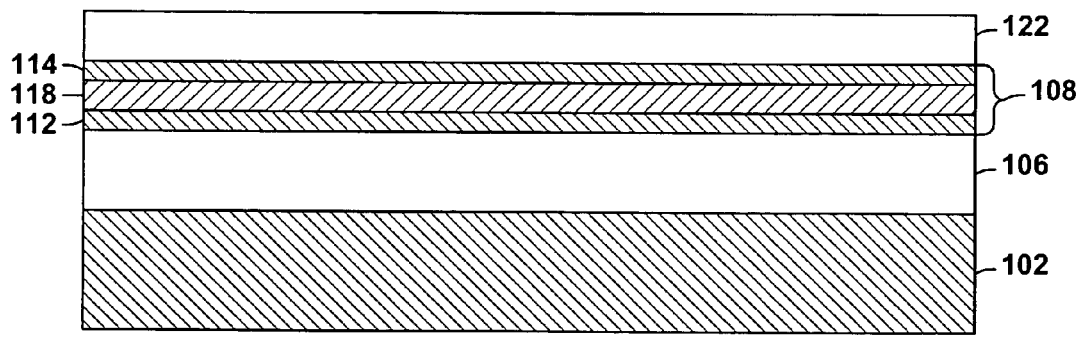
Figure 4:
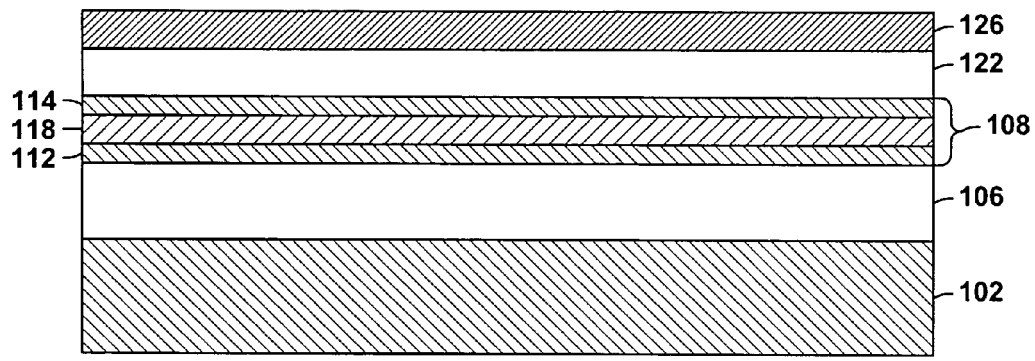

The methodology 10 then advances to 14 where a second metallization layer 122 is formed over the dielectric layer 108. The second metallization layer 122 will serve as a top electrode of the capacitor. As with the first metallization layer 106, the second metallization layer 122 may comprise any one or more suitable conductive materials, such as titanium (Ti), tantalum (Ta), titanium nitride (TiN), tantalum nitride (TiN), etc. formed to a thickness of between about 500 Angstroms and about 3 kilo Angstroms, for example (FIG. 3). A layer of hardmask material 126 is then formed over the second metallization layer 122 at 16 (FIG. 4). The hardmask layer 126 can, for example, be formed of a nitride and/or oxide based material (Ni, O) to a thickness of between about 200 Angstroms and about 500 Angstroms.

Figure 5:
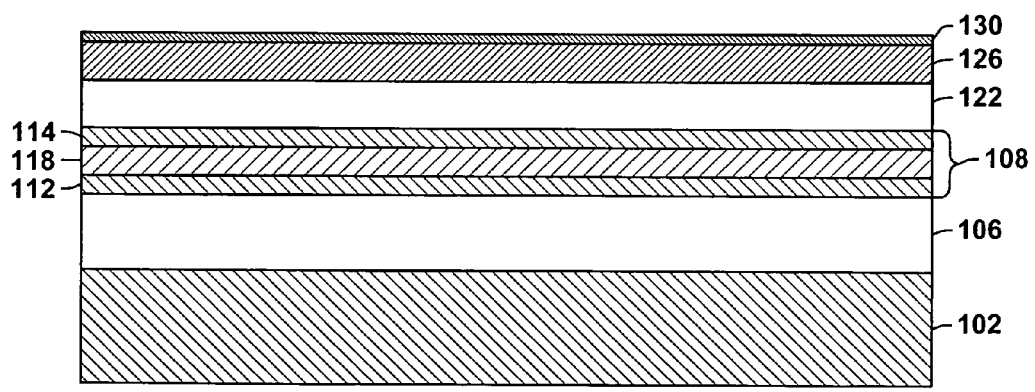

A first layer of resist material 130 is then formed over the hardmask layer 126 at 18 (FIG. 5). The resist material 130 is a radiation sensitive material that facilitates patterning the hardmask layer 126 and second metallization layer 122. More particularly, the resist material 130, hardmask layer 126 and second metallization layer 122 can, at least in part, be patterned with lithographic techniques, where lithography refers to processes for transferring one or more patterns between various media. In lithography, a radiation sensitive resist coating is formed over one or more layers to which a pattern is to be transferred. The resist is itself first patterned by exposing it to type(s) of radiation, where the radiation (selectively) passes through an intervening mask containing the pattern. As a result, the exposed or unexposed areas of the resist coating become more or less soluble, depending on the type of resist used. A developer is then used to remove the more soluble areas leaving the patterned resist. The pattered resist can then serve as a mask for the underlying layers which can be selectively etched to transfer the pattern thereto.

Figure 6:
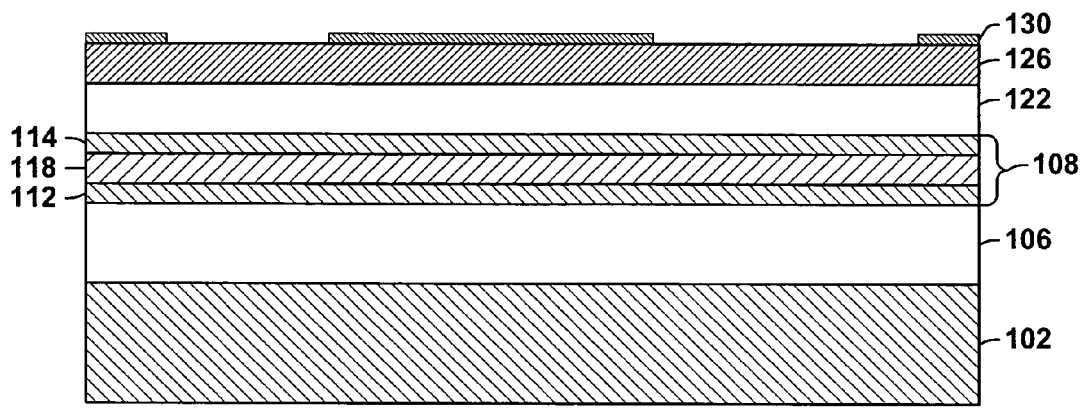
Figure 7:
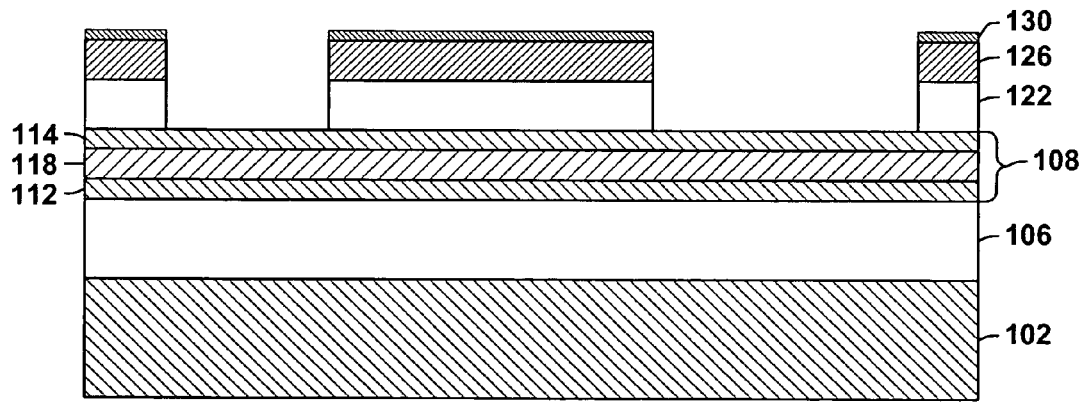

Accordingly, the resist layer 130 (at times referred to as a photoresist due to its sensitivity to radiation) is then patterned at 20 via selective exposure to radiation and subsequent exposure to a developer (FIG. 6). The hardmask layer 126 and second metallization layer 122 are then patterned with the patterned first photoresist layer 130 serving as a mask at 22 (FIG. 7). It will be appreciated that the hardmask layer 126 and second metallization layer 122 may be patterned in a multistage process comprising a dry etch followed by a wet etch. Such an etching process is described in U.S. Pat. No. 6,686,237, which is assigned to the assignee of the present application, and which is hereby incorporated by reference in its entirety. In particular, the hardmask layer 126 is generally etched by a dry etching process followed by a (directional) wet etch that etches the second metallization layer 122. This promotes a "soft landing" on the dielectric layer 108 so as to not disturb or damage the upper layer of dielectric material 114, which can be a mere 50 Angstroms thick, for example. It is important to preserve this layer as well as the other layers 112, 118 of the dielectric layer 108 to maintain the dielectric properties for the capacitor as well as the antireflective behavior needed to accurately pattern the first metallization layer 106.

Figure 8:
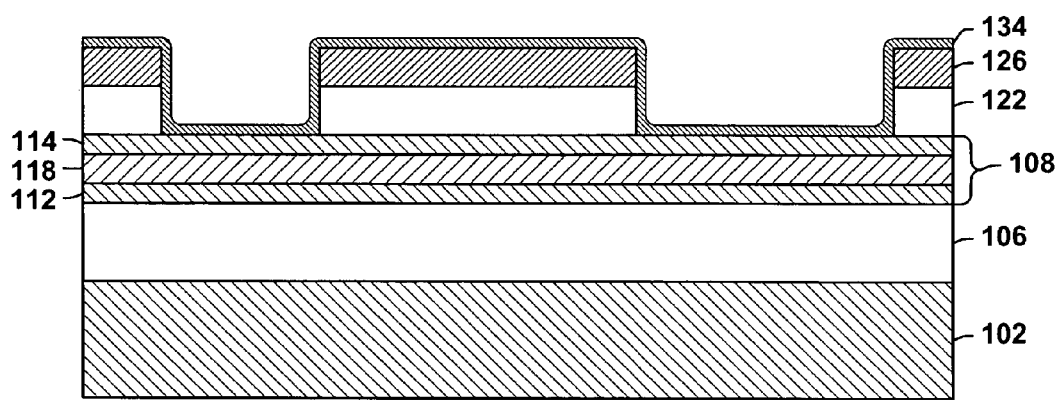
Figure 9:
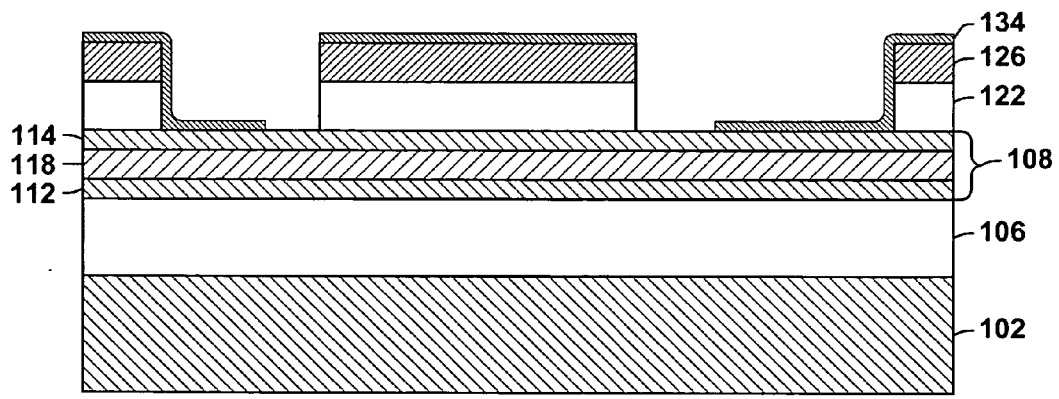

The patterned first resist layer 130 is then stripped and a second layer of resist material 134 is formed over the patterned hardmask layer 126 and second metallization layer 122 at 24 (FIG. 8). The second photoresist layer 134 is patterned at 26 with the dielectric layer 108 serving as an antireflective coating for the first metallization layer 106 (FIG. 9). More particularly, the antireflective layer 118 of the tri-layer dielectric layer 108 has light attenuating properties which mitigate phenomena known as standing waves, among other things, that may develop as photolithographic radiation that is used to pattern the second resist layer 134 is reflected by the first metallization layer 106, where such standing waves can degrade the fidelity of pattern transfers by causing more or less of the second photoresist layer 134 to become more or less soluble, depending upon the type of resist material utilized.

Figure 10:
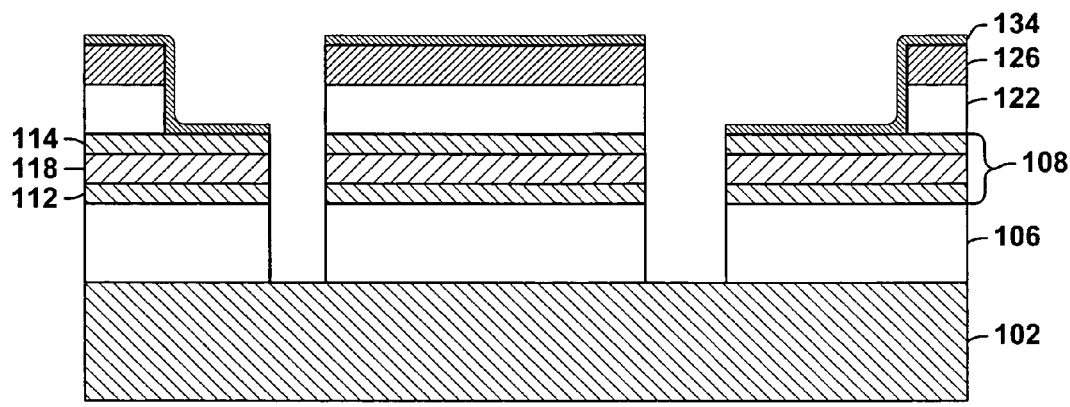
Figure 11:
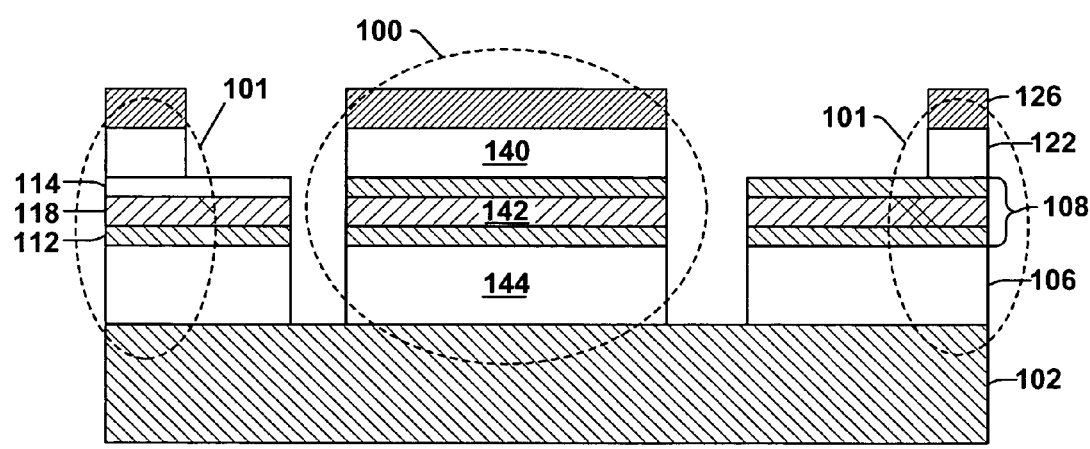

At 28, the dielectric layer 108 and the first metallization layer 106 are patterned with the patterned second resist layer 134 serving as a mask or template (FIG. 10). Finally, the patterned second resist layer 134 is removed at 30 (FIG. 11). As such, the capacitor 100 is defined on the substrate 102 having a capacitor top electrode 140, a capacitor dielectric 142 and a capacitor bottom electrode 144. It will be appreciated that other capacitive elements 101 may similarly persist on the substrate 102, where remaining portions of the conductive first and second metallization layers 106, 122 are separated by remaining portions of the nonconductive dielectric layer 108.

The methodology 10 may then advance for further back end processing (not shown), where, for example, a layer of oxide material may be formed over the entire structure. Such an oxide layer may comprise, for example, silicon oxide based dielectrics and/or OSG materials or any other suitable materials formed to a thickness of between about 4000 to about 8000 Angstroms, for example. Additionally, further patterning can be performed as well as forming conductive contacts down to conductive layers. Remaining portions of the second metallization layer 122 can, for example, be used to establish metal interconnects. Further, forming a capacitor in the manner described herein, e.g., by incorporating the antireflective dielectric layer 118, would allow such metal interconnect lines or leads to be formed at dimensions (e.g., diameter or width) of a quarter (0.25) micron or below.

By way of further example, an exemplary capacitor may have any one or more of the following characteristics:
 the first layer of thin dielectric material 112 has a thickness of about 75 Angstroms;
 the layer of antireflective material 118 has a thickness of about 200 Angstroms;
 the second layer of thin dielectric material 114 has a thickness of about 75 Angstroms;
 the layer of dielectric material 108 has a thickness of about 350 Angstroms;
 the hardmask is a nitride based material (Nit) having a thickness of about 300 Angstroms;
 the capacitor density is 1.23 fF/um$^2$;
 the capacitor density has a standard deviation of 0.01;
 the breakdown voltage is 25.77 volts at 1 milli-amp;
 the breakdown voltage has a standard deviation of 0.3;
 current leakage is −18.23 amps per square micrometer at 5.5. volts;
 current leakage has a standard deviation of 0.04 at 5.5 volts;
 current leakage is −18.15 amps per square micrometer at 8.8 volts;
 current leakage has a standard deviation of 0.02 at 8.8 volts;
 Vcc quad is −6.00 ppM;
 Vcc linear is 6.50 ppM;
 D.A. is 200 ppM; and
 reflectivity percentage is 1.23, or between about 0 and about 1.45.

It will be appreciated that while reference is made throughout this document to exemplary structures in discussing aspects of methodologies described herein (e.g., those structures presented in FIGS. 2–11 while discussing the methodology set forth in FIG. 1), that those methodologies are not to be limited by the corresponding structures presented. Rather, the methodologies (and structures) are to be considered independent of one another and able to stand alone and be practiced without regard to any of the particular aspects depicted in the Figs.

Further, from time to time throughout this specification and the claims that follow, one or more layers or structures may be described as being or containing a substance such as "titanium, tantalum", "silicon nitride", etc. These description are to be understood in context and as they are used in the semiconductor manufacturing industry. For example, in the semiconductor industry, when a metallization layer is described as containing copper, it is understood that the metal of the layer comprises pure copper as a principle component, but the pure copper may be, and typically is, alloyed, doped, or otherwise impure. As another example, silicon nitride may be a silicon rich silicon nitride or an oxygen rich silicon nitride. Silicon nitride may contain some oxygen, but not so much that the material's dielectric constant is substantially different from that of high purity stoichiometric silicon nitride.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example, and can be patterned in any suitable manner (unless specifically indicated otherwise), such as via etching and/or lithographic techniques, for example.

What is claimed is:

1. A method of forming a capacitor as part of an integrated circuit (IC) fabrication process, comprising:
   providing a semiconductor substrate having a first layer of metallization formed thereon;
   forming a layer of antireflective dielectric material over the first layer of metallization, wherein the layer of antireflective dielectric material comprises a layer of antireflective material sandwiched between a first layer of dielectric material and a second layer of dielectric material;
   forming a second layer of metallization over the layer of antireflective dielectric material; and
   patterning the second layer of metallization, the layer of antireflective dielectric material and the first layer of metallization to establish the capacitor which has a top conductive electrode formed from the second layer of metallization, a nonconductive capacitor dielectric formed from the layer of antireflective dielectric material and a bottom conductive electrode formed from the first layer of metallization.

2. The method of claim 1, wherein at least one of;
   the first layer of metallization comprises an about 500 Angstrom layer of titanium nitride (TiN) overlying an about 200 Angstrom layer of Titanium (Ti) that overlies an about 5 kilo Angstrom layer of Aluminum (Al) and/or copper (Cu) overlying an about 140 Angstrom layer of titanium (Ti) that overlies the semiconductor substrate,
   the first layer of dielectric material is formed to a thickness of between about 30 and about 100 Angstroms,
   the second layer of dielectric material is formed to a thickness of between about 30 and about 100 Angstroms,
   the layer of antireflective material is formed to a thickness of between about 150 and about 500 Angstroms,
   the first layer of dielectric material comprises an oxide based material (O),
   the second layer of dielectric material comprises an oxide based material (O),
   the layer of antireflective material comprises a silicon oxy-nitride based material (SiON),
   the second layer of metallization comprises at least one of titanium (Ti), tantalum (Ta), titanium nitride (TiN) and tantalum nitride (TaN) based materials,
   the second layer of metallization is formed to a thickness of between about 500 Angstroms and about 3 kilo Angstroms,
   the capacitor has a capacitive density of about 1.23, and
   the capacitor has a reflectivity of about 1.23.

3. The method of claim 1, further comprising:
   forming a conductive contact to the capacitor having a diameter or width of a quarter (0.25) micron or below.

4. A method of forming a capacitor as part of an integrated circuit (IC) fabrication process, comprising:
   providing a semiconductor substrate having a first layer of metallization formed thereon;
   forming a layer of antireflective dielectric material over the first layer of metallization;
   forming a second layer of metallization over the layer of antireflective dielectric material;
   patterning the second layer of metallization, the layer of antireflective dielectric material and the first layer of metallization to establish the capacitor which has a top conductive electrode formed from the second layer of metallization, a nonconductive capacitor dielectric formed from the layer of antireflective dielectric material and a bottom conductive electrode formed from the first layer of metallization;
   forming a layer of hardmask material over the second layer of metallization;

forming a first layer of resist material over the layer of hardmask material;

patterning the first layer of resist material; and patterning the layer of hardmask material and the second layer of metallization with the patterned first layer of resist material serving as a mask.

5. The method of claim 4, wherein patterning the layer of hardmask material and the second layer of metallization is performed in a multistage process so as to come to a soft landing on the layer of antireflective dielectric material.

6. The method of claim 5, wherein patterning the layer of hardmask material and the second layer of metallization comprises a dry etch followed by a wet etch.

7. The method of claim 6, wherein the layer of hardmask material is patterned by the dry etch and the second layer of metallization is patterned by the wet etch.

8. The method of claim 7, further comprising:

forming a second layer of resist material over the patterned layer of hardmask material and second layer of metallization;

patterning the second layer of resist material with the layer of antireflective material serving to attenuate radiation used to pattern the second layer of resist material that is reflected by the first layer of metallization; and patterning the layer of antireflective dielectric material and the first layer of metallization with the patterned second layer of resist material serving as a mask.

9. The method of claim 4, further comprising:

forming a second layer of resist material over the patterned layer of hardmask material and second layer of metallization;

patterning the second layer of resist material with the layer of antireflective material serving to attenuate radiation used to pattern the second layer of resist material that is reflected by the first layer of metallization; and patterning the layer of antireflective dielectric material and the first layer of metallization with the patterned second layer of resist material serving as a mask.

10. The method of claim 5, further comprising:

forming a second layer of resist material over the patterned layer of hardmask material and second layer of metallization;

patterning the second layer of resist material with the layer of antireflective material serving to attenuate radiation used to pattern the second layer of resist material that is reflected by the first layer of metallization; and patterning the layer of antireflective dielectric material and the first layer of metallization with the patterned second layer of resist material serving as a mask.

11. The method of claim 6, further comprising:

forming a second layer of resist material over the patterned layer of hardmask material and second layer of metallization;

patterning the second layer of resist material with the layer of antireflective material serving to attenuate radiation used to pattern the second layer of resist material that is reflected by the first layer of metallization; and patterning the layer of antireflective dielectric material and the first layer of metallization with the patterned second layer of resist material serving as a mask.

12. The method of claim 4, wherein the layer of antireflective dielectric material comprises a layer of antireflective material sandwiched between a first layer of dielectric material and a second layer of dielectric material and wherein at least one of;

the first layer of metallization comprises an about 500 Angstrom layer of titanium nitride (TiN) overlying an about 200 Angstrom layer of Titanium (Ti) that overlies an about 5 kilo Angstrom layer of Aluminum (Al) and/or copper (Cu) overlying an about 140 Angstrom layer of titanium (Ti) that overlies the semiconductor substrate, the first layer of dielectric material is formed to a thickness of between about 30 and about 100 Angstroms, the second layer of dielectric material is formed to a thickness of between about 30 and about 100 Angstroms, the layer of antireflective material is formed to a thickness of between about 150 and about 500 Angstroms, the first layer of dielectric material comprises an oxide based material (O), the second layer of dielectric material comprises an oxide based material (O), the layer of antireflective material comprises a silicon oxy-nitride based material (SiON), the second layer of metallization comprises at least one of titanium (Ti), tantalum (Ta), titanium nitride (TiN) and tantalum nitride (TaN) based materials, the second layer of metallization is formed to a thickness of between about 500 Angstroms and about 3 kilo Angstroms, the capacitor has a capacitive density of about 1.23, and the capacitor has a reflectivity of about 1.23.

13. The method of claim 8, wherein the layer of antireflective dielectric material comprises a layer of antireflective material sandwiched between a first layer of dielectric material and a second layer of dielectric material and wherein at least one of;

the first layer of metallization comprises an about 500 Angstrom layer of titanium nitride (TiN) overlying an about 200 Angstrom layer of Titanium (Ti) that overlies an about 5 kilo Angstrom layer of Aluminum (Al) and/or copper (Cu) overlying an about 140 Angstrom layer of titanium (Ti) that overlies the semiconductor substrate, the first layer of dielectric material is formed to a thickness of between about 30 and about 100 Angstroms, the second layer of dielectric material is formed to a thickness of between about 30 and about 100 Angstroms, the layer of antireflective material is formed to a thickness of between about 150 and about 500 Angstroms, the first layer of dielectric material comprises an oxide based material (O), the second layer of dielectric material comprises an oxide based material (O), the layer of antireflective material comprises a silicon oxy-nitride based material (SiON), the second layer of metallization comprises at least one of titanium (Ti), tantalum (Ta), titanium nitride (TiN) and tantalum nitride (TaN)( ) based materials, the second layer of metallization is formed to a thickness of between about 500 Angstroms and about 3 kilo Angstroms, the capacitor has a capacitive density of about 1.23, and the capacitor has a reflectivity of about 1.23.

14. The method of claim 5, wherein the layer of antireflective dielectric material comprises a layer of antireflective material sandwiched between a first layer of dielectric material and a second layer of dielectric material and wherein at least one of;
- the first layer of metallization comprises an about 500 Angstrom layer of titanium nitride (TiN) overlying an about 200 Angstrom layer of Titanium (Ti) that overlies an about 5 kilo Angstrom layer of Aluminum (Al) and/or copper (Cu) overlying an about 140 Angstrom layer of titanium (Ti) that overlies the semiconductor substrate,
- the first layer of dielectric material is formed to a thickness of between about 30 and about 100 Angstroms,
- the second layer of dielectric material is formed to a thickness of between about 30 and about 100 Angstroms,
- the layer of antireflective material is formed to a thickness of between about 150 and about 500 Angstroms,
- the first layer of dielectric material comprises an oxide based material (O),
- the second layer of dielectric material comprises an oxide based material (O),
- the layer of antireflective material comprises a silicon oxy-nitride based material (SiON),
- the second layer of metallization comprises at least one of titanium (Ti), tantalum (Ta), titanium nitride (TiN) and tantalum nitride (TaN) based materials,
- the second layer of metallization is formed to a thickness of between about 500 Angstroms and about 3 kilo Angstroms,
- the capacitor has a capacitive density of about 1.23, and
- the capacitor has a reflectivity of about 1.23.

* * * * *